(12) United States Patent
Yin et al.

(10) Patent No.: US 9,107,321 B2
(45) Date of Patent: Aug. 11, 2015

(54) POSITIONING APPARATUS AND ELECTRONIC DEVICE USING THE SAME

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Xiao-Gang Yin, Shenzhen (CN); Zheng-Bing Song, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 218 days.

(21) Appl. No.: 13/928,209

(22) Filed: Jun. 26, 2013

(65) Prior Publication Data

US 2014/0355209 A1    Dec. 4, 2014

(30) Foreign Application Priority Data

May 31, 2013    (CN) .......................... 2013 1 02122456

(51) Int. Cl.
*G06F 1/16*    (2006.01)
*H05K 7/14*    (2006.01)

(52) U.S. Cl.
CPC .................................... *H05K 7/1489* (2013.01)

(58) Field of Classification Search
USPC ................ 312/223.6, 223.1, 223.2, 236, 326, 312/293.3, 265.4, 333, 334.6, 198.211, 312/333.46; 361/679.32, 679.02, 679.47, 361/679.58, 679.523, 679.31, 679.46, 361/679.39, 679.48, 679.33, 679.08, 679.3; 165/104.11, 80.2, 104.21, 104.19, 165/80.3, 185, 104.33, 80.5, 11.1, 80.4; 248/206.5, 222.12, 220.31, 205.1, 49, 248/906, 346.01, 282.1, 309.1; 700/286, 700/295, 300, 235, 231, 244, 236, 160
See application file for complete search history.

(56) References Cited

U.S. PATENT DOCUMENTS 6,820,954 B2 * 11/2004 Judge et al. .............. 312/334.46
2006/0002005 A1 * 1/2006 Miyazaki et al. .......... 360/97.01
2013/0063888 A1 * 3/2013 Wang ....................... 361/679.48

* cited by examiner

*Primary Examiner* — Hung Duong
(74) *Attorney, Agent, or Firm* — Novak Druce Connolly Bove + Quigg LLP

(57) ABSTRACT

A positioning apparatus for installing a server unit on a rack includes a frame fixed to the server unit, an operation member slidably installed to the frame, a pivot member sandwiched between the frame and the operation member, and a resilient member connected between the frame and the operation member. A rear end of the pivot member is rotatably connected to the frame, and a latching piece protrudes out from a front end of the pivot member. The pivot member defines a guiding slot. The frame defines a through slot aligning with the latching piece. The operation member includes a sliding pole protruding from the operation member and extending through the guiding slot. The resilient member biases the operation member to move, the sliding pole slides in the guiding slot to rotate the pivot member, and the latching piece extends through the through slot to latch onto the rack.

18 Claims, 6 Drawing Sheets

POSITIONING APPARATUS AND ELECTRONIC DEVICE USING THE SAME

BACKGROUND

1. Technical Field

The present disclosure relates to electronic devices, and particularly to an electronic device with a positioning apparatus for a movable module.

2. Description of Related Art

Server units are generally mounted on a rack with screws. However, it is time-consuming and often difficult to disassemble the server units from the rack when they need to be replaced or repaired.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean "at least one."

Figure 1:
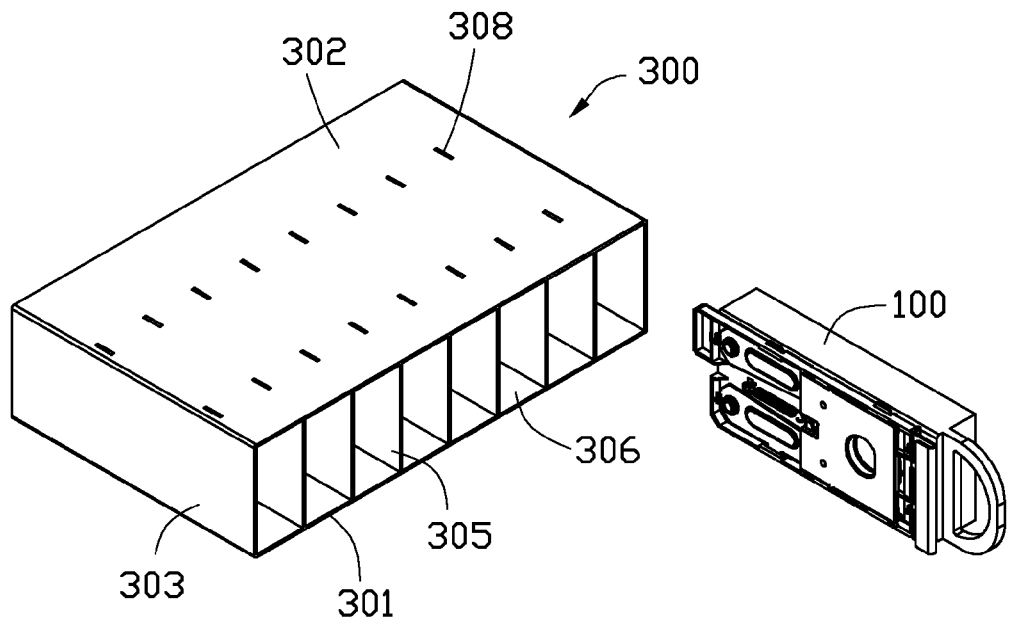
FIG. 1 is an exploded, isometric view of an embodiment of an electronic device, the electronic device including a movable module.

FIG. 1 shows an embodiment of an electronic device including a rack 300 and a movable module 100. The rack 300 includes a bottom wall 301, a top wall 302 opposite to the bottom wall 301, two opposite end walls 303 connected substantially perpendicularly between the bottom wall 301 and the top wall 302, and a plurality of spaced partition plates 305 connected substantially perpendicularly between the bottom wall 301 and the top wall 302. The rack 300 is divided into a plurality of receiving spaces 306 by the partition plates 305. The bottom wall 301 and the top wall 302 each define a pair of latching holes 308 corresponding to each receiving space 306.

Figure 2:
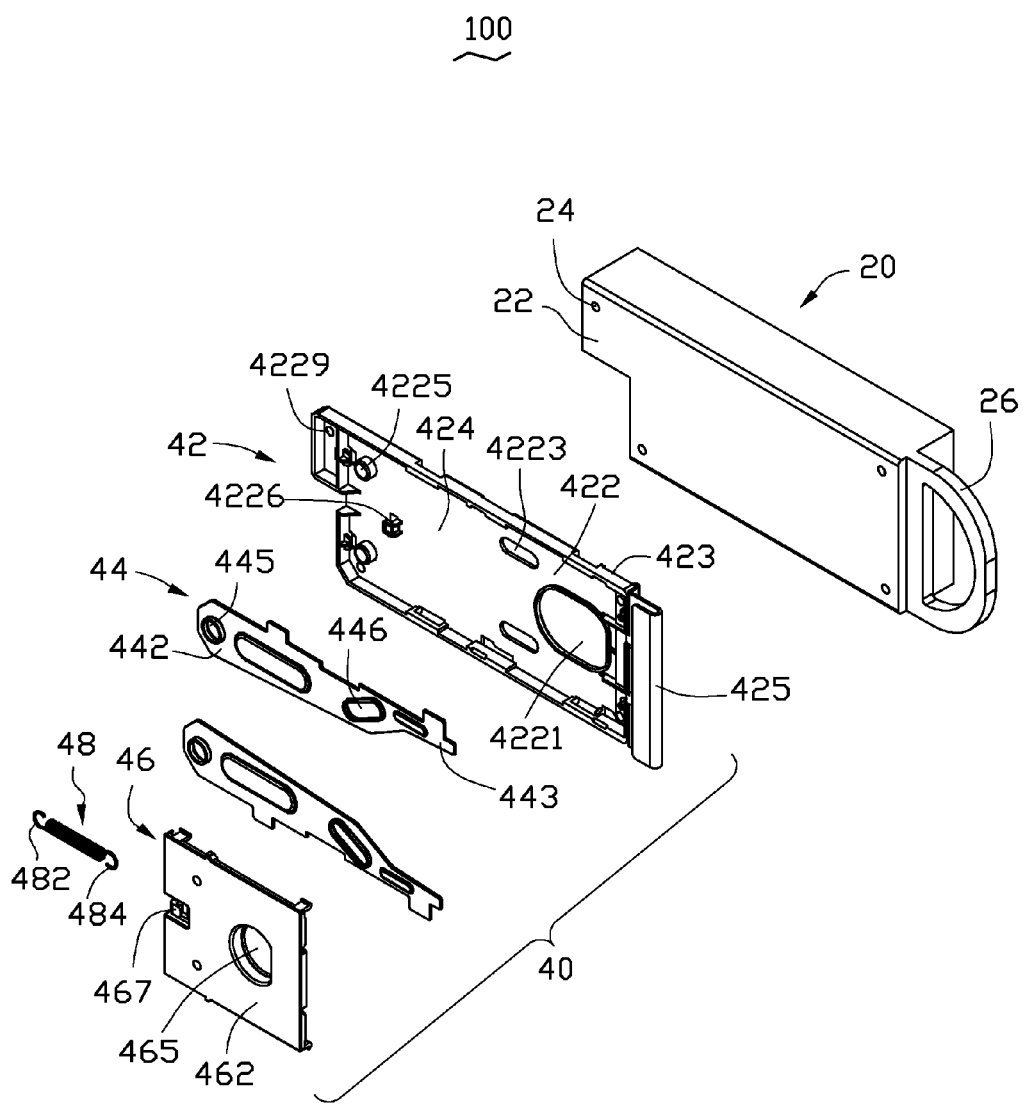
FIG. 2 is an exploded, isometric view of the movable module of FIG. 1.
Figure 3:
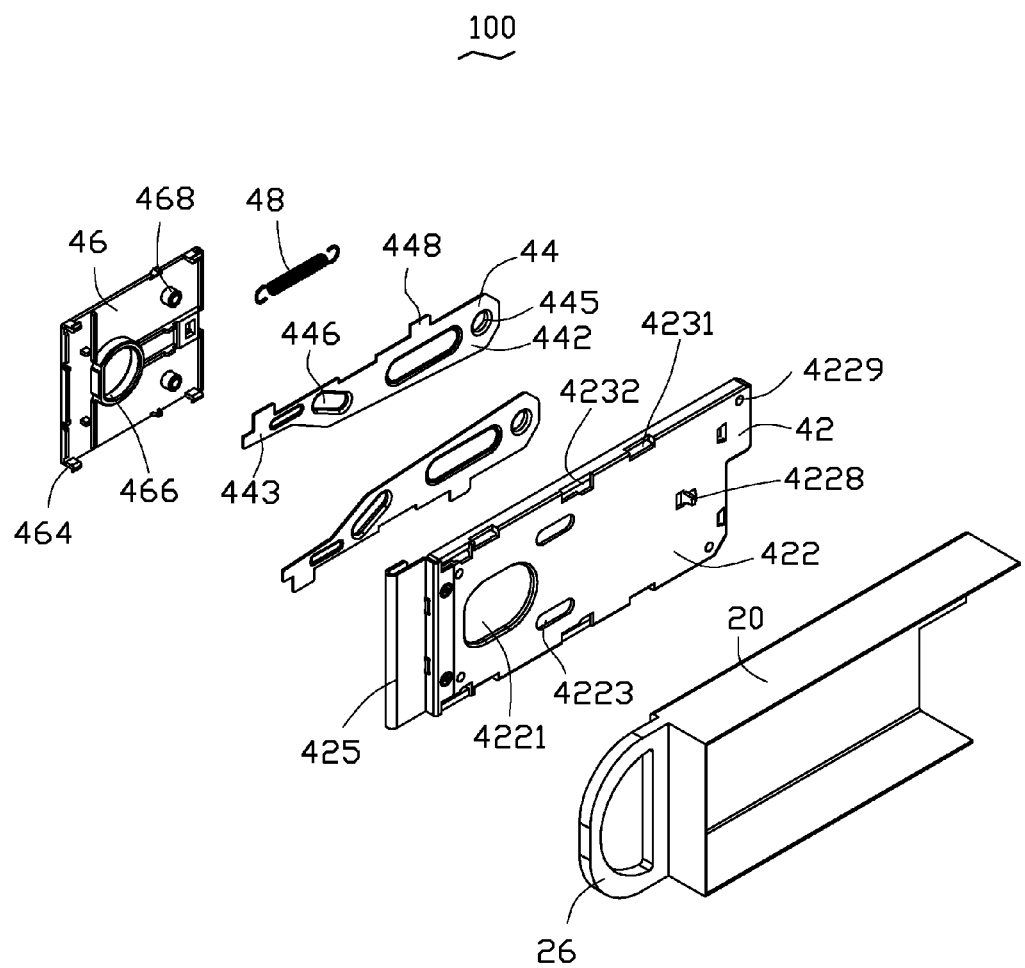
FIG. 3 is similar to FIG. 2, but viewed from another perspective.

FIG. 2 and FIG. 3 show the movable module 100 including a server unit 20 and a positioning apparatus 40. A plurality of components (not shown), such as a motherboard and a data storage apparatus, is installed in the server unit 20. The server unit 20 includes a substantially rectangular side plate 22 and a U-shaped operation portion 26 protruding from a front end of the side plate 22. The side plate 22 defines a plurality of screw holes 24 in four of its corners.

The positioning apparatus 40 includes a frame 42, two pivot members 44, an operation member 46, and a resilient member 48.

The frame 42 includes a substantially rectangular connecting plate 422, two opposite flanges 423 protruding substantially perpendicularly out from two opposite sides of the connecting plate 422, and a U-shaped hook 425 protruding forward from a front end of the connecting plate 422. The connecting plate 422 and the flanges 423 cooperatively bound a receiving space 424. The front end of the connecting plate 422 defines a long opening 4221 approximately along a centerline of the connecting plate 422 and two substantially parallel slide slots 4223 in two opposite sides of the connecting plate 422. The opening 4221 is located adjacent to the hook 425, and the slide slots 4223 are located adjacent to the flanges 423. A junction of the connecting plate 422 and each flange 423 defines two spaced through slots 4231 and two spaced guiding slots 4232. Two shafts 4225 protrude substantially perpendicularly in from a rear end of the connecting plate 422 adjacent to the two flanges 423. A first hook 4226 protrudes in from the rear end of the connecting plate 422 between the shafts 4225. A mounting block 4228 protrudes substantially perpendicularly out from the rear end of the connecting plate 422 opposite to the shafts 4425. The connecting plate 422 defines four through holes 4229 in four of its corners.

Each pivot member 44 includes a rectangular pivot plate 442 and an extending plate 443 extending forward from a front end of the pivot plate 442. A rear end of the pivot plate 442 defines a shaft hole 445. A junction of the pivot plate 442 and the extending plate 443 slantingly defines a guiding slot 446. Two spaced latching pieces 448 protrude out from sides of the pivot plate 442 and the extending plate 443.

The operation member 46 includes a rectangular sliding plate 462 and four guiding hooks 464 extending substantially perpendicularly from four of its corners along a same direction. A front end of the sliding plate 462 defines an operation hole 465. A guiding rim 466 extends substantially perpendicularly from the sliding plate 462 around the operation hole 465 and extends substantially along the same direction as the guiding hooks 464. A second hook 467 protrudes out from a rear end of the sliding plate 462. Two spaced sliding poles 468 protrude substantially perpendicularly from the rear end of the sliding plate 462, opposite to the second hook 467.

In one embodiment, the resilient member 48 is a coil spring and includes a first positioning end 482 and a second positioning end 484 opposite to the first positioning end 482.

In assembly of the positioning apparatus 40, the pivot members 44 are placed in the receiving space 424 of the frame 42. The pivot members 44 are located at two opposite sides of the receiving space 424, with the latching pieces 448 of each pivot member 44 aligning with the adjacent through slots 4231. The shafts 4225 are rotatably inserted into the shaft holes 445 of the pivot members 44. The sliding poles 468 extend through the guiding slots 446 of the pivot members 44 and are slidably received in the slide slots 4223 of the frame 42. The guiding rim 466 slidably inserts into the opening 4221 of the frame 42, and the guiding hooks 464 hook into the guiding slots 4232 of the frame 42 onto an outer surface of the connecting plate 422. Thus, the operation member 46 is slidably installed onto the frame 42. The first positioning end 482 of the resilient member 48 is hooked to the first hook 4226 of the frame 42, and the second positioning end 484 of the resilient member 48 is hooked to the second hook 467 of the operation member 46. The resilient member 48 biases the operation member 46 to move adjacent to the shafts 4225. The guiding hooks 464 are slid in the guiding slots 4232, the guiding rim 466 is slid in the guiding opening 4221, and the sliding poles 468 are slid in the guiding slots 446 and the corresponding slide slots 4223. Thus, the sliding poles 468 slidably abut against inner walls bounding the guiding slots 446, causing the pivot members 44 to rotate away from each other, such that the latching pieces 448 extend through the corresponding through slots 4231.

In assembly of the positioning apparatus 40 to the server unit 20, the outer surface of the frame 42 engages with the side plate 22 with the hook 425 adjacent to the operation portion 26. The mounting block 4228 is latched to a rear end of the side plate 22. A plurality of screws (not shown) extends through the through holes 4229 into the corresponding screw holes 24.

Figure 4:
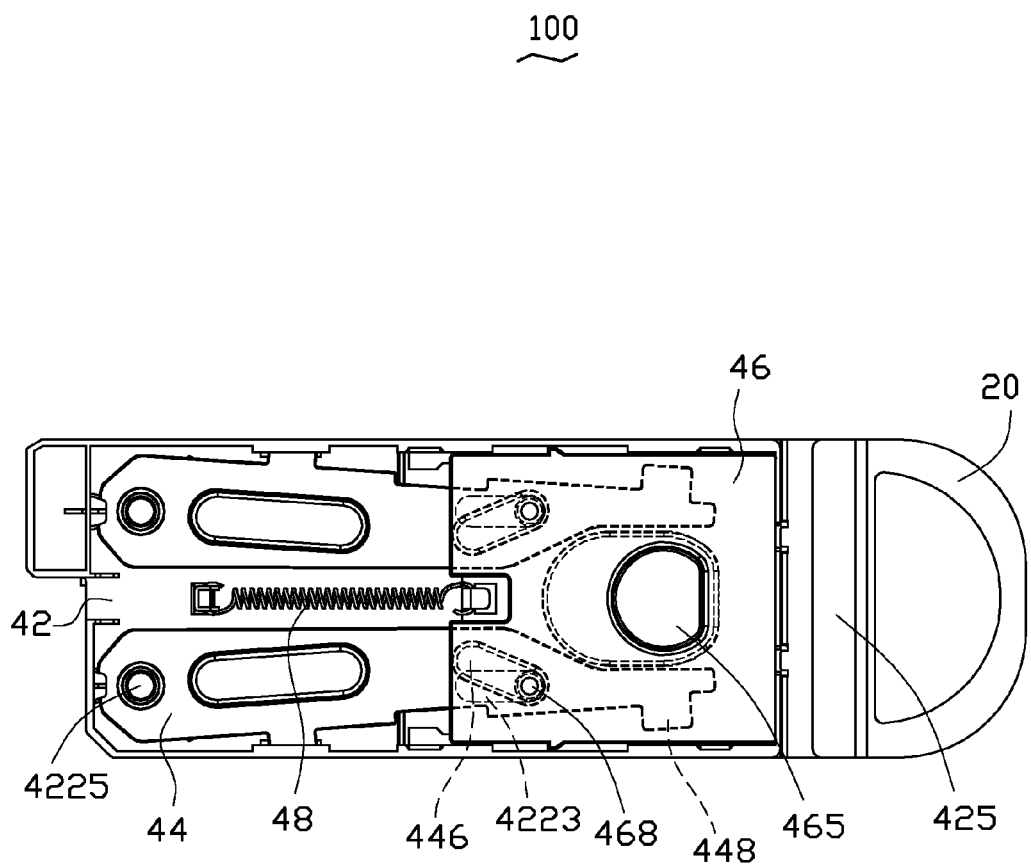
FIG. 4 is a side plan view of the movable module of FIG. 1 in a state of use.
Figure 5:
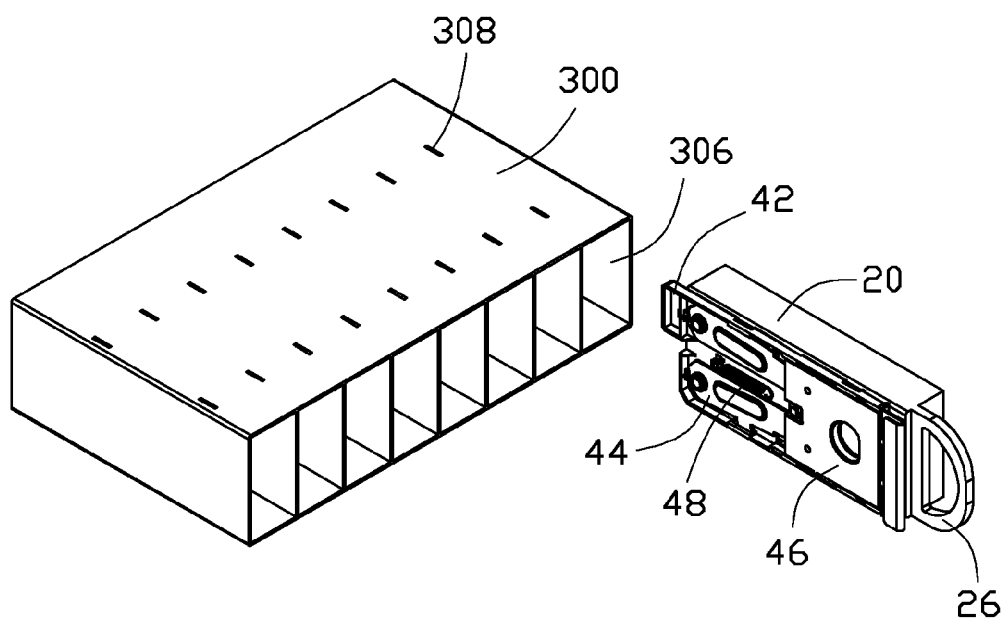
FIG. 5 and FIG. 6 are isometric views showing the processes of assembling the movable module to the electronic device of FIG. 1.
Figure 6:
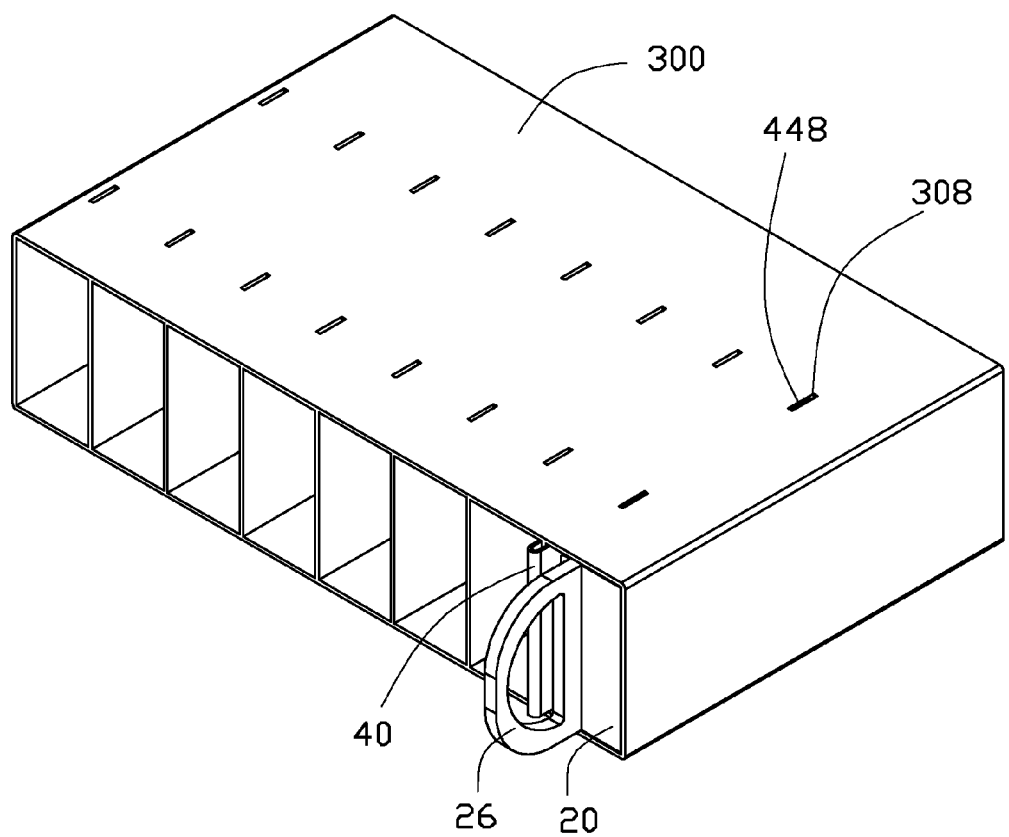

FIGS. 4-6 show that to install the movable module 100 to the rack 300, the operation member 46 is slid adjacent to the hook 425 by pulling the operation member 46 by the operation hole 465 to deform the resilient member 48. The sliding poles 468 slidably abut against the inner walls bounding the guiding slots 446, causing the pivot members 44 to rotate toward each other. Each pivot member 44 is rotated about the corresponding shaft 4225, such that the latching pieces 448 are received in the receiving space 424 of the frame 42. The rear end of the movable module 100 is inserted into the receiving space 306 of the rack 300. The sliding plate 462 is released, and the resilient member 48 is partially restored to bias the operation member 46 to move away from the hook 425. The sliding poles 468 slidably abut against the inner walls bounding the guiding slots 446, causing the pivot members 44 to rotate away from each other, such that the latching pieces 448 abut against the inner surfaces of the top wall 302 and the bottom wall 301, respectively. The operation portion 46 is slid further to move the movable module 100 into the receiving space 306 further until the through slots 4231 align with the latching holes 308 of the rack 300. The resilient member 48 is further restored to bias the latching pieces 448 to extend through the through slots 4231 and the corresponding latching holes 308, thus installing the movable module 100 into the rack 300.

To detach the movable module 100 from the rack 300, the operation member 46 is slid adjacent to the hook 425 by pulling the operation member 46 by the operation hole 465, deforming the resilient member 48. This causes the pivot members 44 to rotate toward each other, such that the latching pieces 448 detach from the latching holes 308. Thus, the movable module 100 is easily separated from the rack 300.

It is to be understood, however, that even though numerous characteristics and advantages of the embodiment have been set forth in the foregoing description, together with details of the structure and function of the embodiment, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A positioning apparatus for installing a server unit in a rack, comprising:
    a frame fixed to the server unit;
    an operation member slidably installed to the frame and comprising a sliding pole;
    a pivot member sandwiched between the frame and the operation member, a rear end of the pivot member rotatably connected to the frame;
    a latching piece protruding out from a front end of the pivot member; and
    a resilient member connected between the frame and the operation member;
    wherein the pivot member defines a first guiding slot; the frame defines a through slot aligning with the latching piece; the sliding pole extends through the first guiding slot; when the resilient member biases the operation member to move adjacent to the rear end of the pivot member, the sliding pole slides in the first guiding slot of the pivot member to rotate the pivot member; the latching piece extends through the through slot to be latched to the rack; wherein when the operation member is slid away from the rear end of the pivot member, the resilient member is deformed and the pivot member is rotated, to detach the latching piece from the rack.

2. The positioning apparatus of claim 1, wherein the frame comprises a connecting plate and a flange protruding out from a side of the connecting plate, the connecting plate and the flange cooperatively bound a receiving space, the pivot member and the operation member are received in the receiving space, and the through slot is defined in a junction of the connecting plate and the flange.

3. The positioning apparatus of claim 2, wherein the pivot member comprises a pivot plate, the first guiding slot is slantingly defined in a front end of the pivot plate adjacent to the operation member, the latching piece protrudes from a side of the pivot plate toward the through slot of the frame.

4. The positioning apparatus of claim 3, wherein a rear end of the pivot plate defines a shaft hole away from the operation member, a shaft protrudes in from the connecting plate and is rotatably inserted in the shaft hole of the pivot plate.

5. The positioning apparatus of claim 4, wherein the connecting plate defines a slide slot extending along a sliding direction of the operation member, the slide slot aligns with the first guiding slot of the pivot member, and the sliding pole slidably extends through the first guiding slot of the pivot member and is slidably received in the slide slot of the frame; when the operation member is slid away from the shaft, the resilient member is deformed, and the sliding pole slidably abuts against an inner wall bounding the first guiding slot, to rotate the pivot member away from the flange, to allow the latching piece to detach from the through slot of the frame.

6. The positioning apparatus of claim 4, wherein a first hook protrudes in from the connecting plate adjacent to the shaft, a second hook protrudes out from the operation member, and the resilient member comprises a first positioning end latched to the first hook, and a second positioning end latched to the second hook.

7. The positioning apparatus of claim 4, wherein the connecting plate defines an opening extending along a sliding direction of the operation member, the operation member defines an operation hole aligning with the opening, a guiding rim extends from the operation member around the operation hole and is slidably inserted in the opening of the connecting plate.

8. The positioning apparatus of claim 4, wherein the connecting plate defines a second guiding slot extending along a sliding direction of the operation member, and a guiding hook extends from the operation member and is slidably received in the second guiding slot.

9. The positioning apparatus of claim 4, wherein a mounting block protrudes out from a rear end of the connecting plate and is latched to the server unit.

10. An electronic device, comprising:
    a rack comprising a wall bounding a first receiving space, the wall defining a latching hole communicating with the first receiving space; and a movable module slidably inserted in the first receiving space of the rack, and comprising:
a server unit;
a frame fixed to the server unit;
an operation member slidably installed to the frame and comprising a sliding pole;
a pivot member sandwiched between the frame and the operation member, a rear end of the pivot member rotatably connected to the frame;
a latching piece protruding out from a front end of the pivot member; and
a resilient member connected between the frame and the operation member;
wherein the pivot member defines a first guiding slot; the frame defines a through slot aligning with the latching piece and the latching hole of the rack; the sliding pole extends through the first guiding slot; when the resilient member biases the operation member to move adjacent to the rear end of the pivot member, the sliding pole slides in the first guiding slot of the pivot member to rotate the pivot member; the latching piece extends through the through slot to be latched in the latching hole of the rack, wherein when the operation member is slid away from the rear end of the pivot member to deform the resilient member, the pivot member is rotated, to detach the latching piece from the latching hole.

11. The electronic device of claim 10, wherein the frame comprises a connecting plate and a flange protruding out from a side of the connecting plate, the connecting plate and the flange cooperatively bound a second receiving space, the pivot member and the operation member are received in the second receiving space, and the through slot is defined in a junction of the connecting plate and the flange.

12. The electronic device of claim 11, wherein the pivot member comprises a pivot plate, the first guiding slot is slantingly defined in a front end of the pivot plate adjacent to the operation member, the latching piece protrudes from a side of the pivot plate toward the through slot of the frame.

13. The electronic device of claim 12, wherein a rear end of the pivot plate defines a shaft hole away from the operation member, a shaft protrudes in from the connecting plate and is rotatably inserted in the shaft hole of the pivot plate.

14. The electronic device of claim 13, wherein the connecting plate defines a slide slot extending along a sliding direction of the operation member, the slide slot aligns with the first guiding slot of the pivot member, and the sliding pole slidably extends through the first guiding slot of the pivot member and is slidably received in the slide slot of the frame; when the operation member is slid away from the shaft, the resilient member is deformed, and the sliding pole slidably abuts against an inner wall bounding the first guiding slot, to rotate the pivot member away from the flange, to allow the latching piece to detach from the latching hole.

15. The electronic device of claim 13, wherein a first hook protrudes in from the connecting plate adjacent to the shaft, a second hook protrudes out from the operation member, and the resilient member comprises a first positioning end latched to the first hook and a second positioning end latched to the second hook.

16. The electronic device of claim 13, wherein the connecting plate defines an opening extending along a sliding direction of the operation member, the operation member defines an operation hole aligning with the opening, a guiding rim extends from the operation member around the operation hole and is slidably inserted in the opening of the connecting plate.

17. The electronic device of claim 13, wherein the connecting plate defines a second guiding slot extending along a sliding direction of the operation member, and a guiding hook extends from the operation member and is slidably received in the second guiding slot.

18. The electronic device of claim 13, wherein a mounting block protrudes out from a rear end of the connecting plate and is latched to the server unit.

\* \* \* \* \*